United States Patent
Kaiser et al.

(10) Patent No.: US 6,178,124 B1
(45) Date of Patent: Jan. 23, 2001

(54) INTEGRATED MEMORY HAVING A SELF-REPAIR FUNCTION

(75) Inventors: Robert Kaiser, Kaufering; Florian Schamberger, Bad Reichenhall; Helmut Schneider, München, all of (DE)

(73) Assignee: Siemens Aktiengesllschaft, Munich (DE)

( * ) Notice: Under 35 U.S.C. 154(b), the term of this patent shall be extended for 0 days.

(21) Appl. No.: 09/401,388

(22) Filed: Sep. 22, 1999

(30) Foreign Application Priority Data

Sep. 22, 1998 (DE) ............................................. 198 43 470

(51) Int. Cl.$^7$ .................................................... G11C 7/00
(52) U.S. Cl. ........................................... 365/200; 365/201
(58) Field of Search ...................................... 365/200, 201

(56) References Cited

U.S. PATENT DOCUMENTS

| 5,313,424 | 5/1994 | Adams et al. ........................ 365/200 |
| 5,852,580 | * 12/1998 | Ha ...................................... 365/200 |
| 5,854,764 | * 12/1998 | Villa et al. ........................... 361/200 |

FOREIGN PATENT DOCUMENTS

19625626A1    1/1998  (DE) .

* cited by examiner

Primary Examiner—David Nelms
Assistant Examiner—M. Tran
(74) Attorney, Agent, or Firm—Herbert L. Lerner; Laurence A. Greenberg; Werner H. Stemer

(57) ABSTRACT

The integrated memory has memory cells which are combined to form individually addressable standard units, and one or more redundant units for replacing one of the standard units on an address basis. The memory also has a self-test unit for performing a function test on the memory cells and for performing an analysis as to which of the standard units is to be replaced by a respective redundant unit. There is also a first memory unit for storing the address, determined by the self-test unit, of the standard unit which is to be replaced by the redundant unit, and a comparison unit connected to an address bus and to outputs of the first memory unit, for comparing an address present on the address bus with the address stored in the first memory unit. The comparison unit activates the redundant unit if a match is recognized. The first memory unit has at least one output which is connected to a corresponding output of the integrated circuit for outputting the respectively stored address.

6 Claims, 2 Drawing Sheets

INTEGRATED MEMORY HAVING A SELF-REPAIR FUNCTION

BACKGROUND OF THE INVENTION

Field of the Invention

The invention relates to an integrated memory having a self-repair function.

To repair faulty memory cells, integrated memories have redundant word lines or redundant bit lines. These redundant lines can replace regular lines with faulty cells on an address basis. It is known practice to test integrated memories via their external connections using external testing devices and then to program the redundant elements externally using a laser beam. The redundancy circuit then has programmable elements in the form of laser fuses which are used to store the address of a line which is to be replaced. The laser fuses are electrical connection elements which can be severed at the end of the production process for the integrated memory using the laser beam. This methodv requires an external testing device for carrying out the memory cell test. It also has the disadvantage that the signals needed to carry out the test have to be transmitted via the external connections of the memory, which are restricted in number. This means that the bandwidth of the test signals is limited and such a test takes a relatively long time.

A memory having a self-repair function is disclosed in U.S. Pat. No. 5,313,424 to Adams et al. A self-test unit tests the memory cells in the memory and then stores the address of defective word lines in an appropriate address register. The memory is then supplied externally with an activation signal having a high potential level, and severable electrical connection elements (fuses), which are component parts of a redundancy circuit, are then destroyed to code the faulty word addresses stored in the address register. The fuses are destroyed with a high current that causes them to melt.

The self-test described in U.S. Pat. No. 5,313,424 for the memory with subsequent self-repair has the advantage that no external testing device is needed to carry out the memory cell test, and that the bandwidth for the test signals is not limited by the number of external connections of the memory. However, the results of the memory cell test, i.e. the addresses of the faulty word lines, remain "hidden" in the integrated memory. Accordingly, analysis of the faults which occur, which is of interest to the manufacturer of the memory, is not possible.

SUMMARY OF THE INVENTION

It is accordingly an object of the invention to provide an integrated memory which has a self-repair function, which overcomes the above-mentioned disadvantages of the heretofore-known devices and methods of this general type and which allows an external analysis of the faults discovered in the repair test.

With the foregoing and other objects in view there is provided, in accordance with the invention, an integrated memory of an integrated circuit, comprising:

a plurality of memory cells combined to form individually addressable standard units;

a redundant unit for replacing one of the standard units on an address basis;

a self-test unit adapted to perform a function test on the memory cells and to analyze which of the standard units is to be replaced with the redundant unit;

a first memory unit for storing an address, determined by the self-test unit, of the standard unit to be replaced by the redundant unit;

an address bus; and a comparison unit connected to the address bus and to outputs of the first memory unit, for comparing an address present on the address bus with the address stored in the first memory unit and for activating the redundant unit if the addresses match;

the first memory unit having at least one output connected to an output of the integrated circuit for outputting the address stored in the first memory unit.

In accordance with an added feature of the invention, there are provided a plurality of redundant units.

The integrated memory according to the invention is a component part of an integrated circuit and has memory cells which are combined to form individually addressable standard (normal) units. The redundant unit replaces one of the standard units on an address basis. The self-test unit performs a function test on the memory cells and an analysis as to which of the standard units is to be replaced by the redundant unit. The memory also has a first memory unit for storing the address, determined by the self-test unit, of the standard unit which is to be replaced by the redundant unit, and a comparison unit, which is connected to an address bus and to outputs of the first memory unit, for comparing an address present on the address bus with the address stored in the first memory unit and for activating the redundant unit if a match is recognized. In this arrangement, the first memory unit has at least one output which is connected to a corresponding output of the integrated circuit for outputting the respectively stored address.

The invention is suitable for any memories in which faulty units are repaired by, and readdressed to redundant units. The standard or redundant units can be word lines or bit lines or entire memory blocks of the memory, for example. The integrated memory may be a writable memory, for example, such as a DRAM, SRAM, flash memory or EEPROM.

The first memory unit of the integrated memory is used for a dual function:

Firstly, it stores the address of the faulty standard unit to be replaced and passes this to the comparison unit, so that the latter can activate the redundant unit if the appropriate address is present on the address bus. Secondly, the first memory unit is used to output the respectively stored address to outside the integrated circuit. Hence, if required, the manufacturer of the integrated circuit can ascertain whether faults were discovered during the self-test of the memory and whether a self-repair was carried out. It is also possible for the manufacturer to ascertain the address of the faults discovered.

In accordance with an additional feature of the invention, the first memory unit is a volatile memory unit, and a nonvolatile second memory unit for storing an address supplied from outside the integrated circuit, the second memory unit having at least one output which is connected to a corresponding input of the first memory unit for transmitting an address stored in the second memory unit to the first memory unit.

The fact that the first memory unit of the integrated memory is volatile means it stores the address, determined by the self-test unit, of the standard unit to be replaced in a nonpermanent manner. The memory according to the development also has a nonvolatile second memory unit for permanently storing an address which can be supplied from outside the integrated circuit, the second memory unit having at least one output which is connected to a corresponding input of the first memory unit, so that an address stored in the second memory unit can be transmitted to the first memory unit.

A volatile memory unit, such as an address register or address latch, can easily have information written to it by a self-test unit, since no voltages or large currents beyond the normal signal level of the memory are required for this. Provision of the second memory unit has the advantage that the self-test of the memory does not need to be repeated every time the first memory unit (for example after the supply voltage has been switched off) has lost the address stored in it. Since the first memory unit is volatile, it would otherwise be necessary, for example whenever the memory were initialized, to have the self-test determine once again the address of the standard units to be replaced. Since the first memory unit permits, via its output, the address stored in it to be output to outside the integrated circuit, this address can then be stored permanently in the second memory unit externally. To restore the memory content of the volatile first memory unit, for example whenever the memory is initialized after the supply voltage has been applied, all that is required then is for the address stored in the second memory unit to be transmitted to the first memory unit.

In accordance with another feature of the invention, the second memory unit includes nonvolatile memory elements for storing the address, the nonvolatile memory elements having electrical connections that can be severed with an energy beam. The energy beam can be a laser beam, for example. In the latter case, a second memory unit can be programmed externally using the laser beam, as in the case of customary redundancy programming at the end of production of the integrated circuit.

In accordance with a further feature of the invention, the output of the first memory unit is a serial output for outputting the stored address bit by bit. The first memory unit then has only this one output, which is connected to a corresponding output of the integrated circuit. All that is then required is a single output for the integrated circuit in order to transmit the address, determined by the self-test unit, of the faulty standard unit to outside the integrated circuit. This individual output requires only a relatively small surface area on the integrated circuit.

In accordance with a concomitant feature of the invention, the first memory unit is a shift register. This enables the stored address to be output serially bit by bit with particular ease.

Other features which are considered as characteristic for the invention are set forth in the appended claims.

Although the invention is illustrated and described herein as embodied in an integrated memory having a self-repair function, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
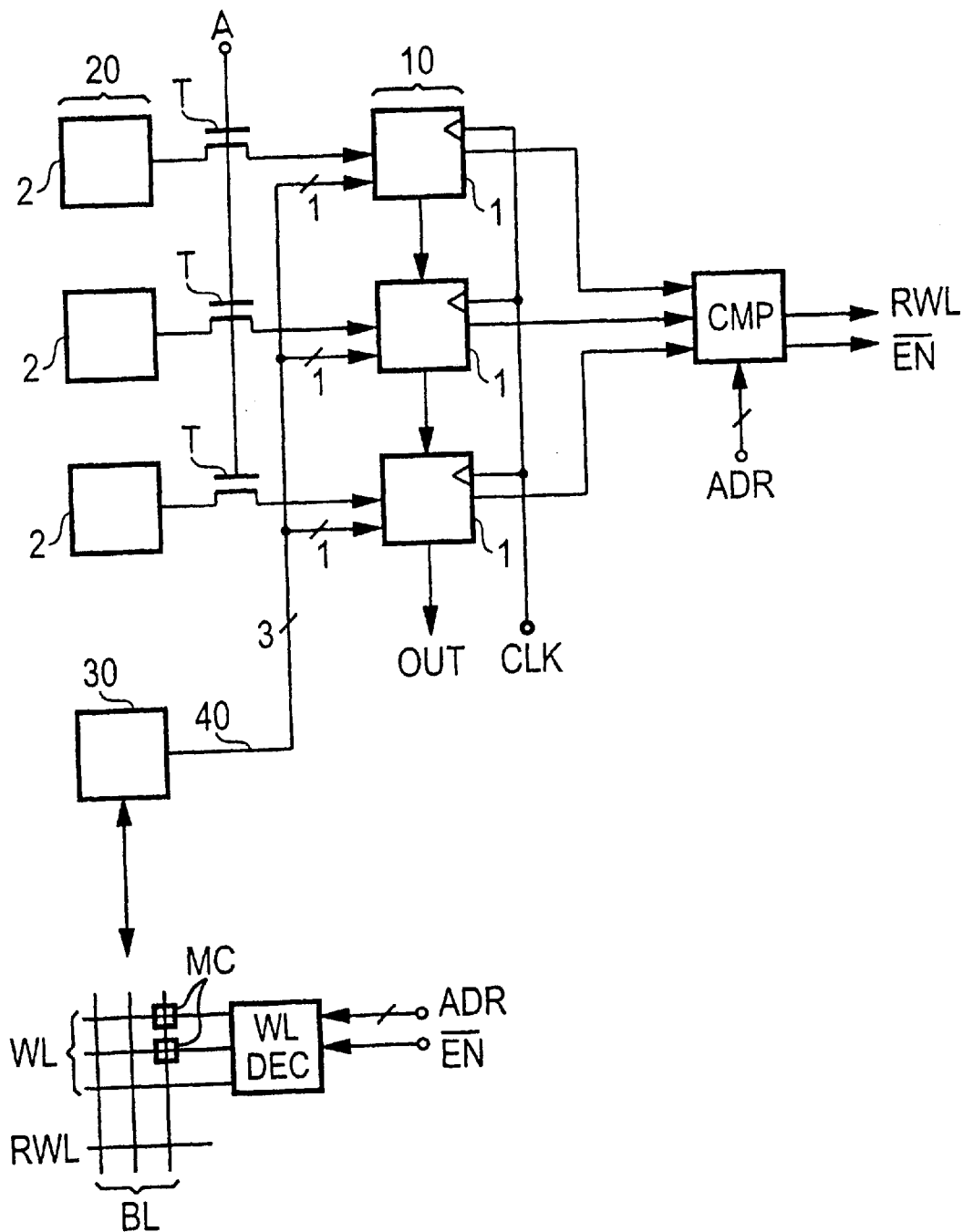
FIG. 1 is a block diagram of an exemplary embodiment of the integrated memory.

Referring now to the figures of the drawing in detail and first, particularly, to FIG. 1 thereof, there is seen a memory cell array in the integrated memory. The array has word lines WL and bit lines BL which have memory cells MC arranged at their intersections. A self-test unit 30 in the memory tests the operation of the memory cells MC by generating test patterns and writing appropriate test data to the memory cells, then reading it out again and comparing it with appropriate nominal values. During or after the self-test on the memory cells MC by the self-test unit 30, the latter carries out a redundancy analysis. During the redundancy analysis, it determines which of the standard word lines WL is to be replaced, on an address basis, by a redundant word line RWL during repair on account of defects in the memory cells MC associated with the word lines WL.

For better understanding, the invention is explained with reference to FIG. 1 only with reference to a single redundant word line RWL, so that only one of the standard word lines WL can be repaired. In practice, an integrated memory generally has a plurality of redundant lines. In addition, the invention can be applied just as well to redundant bit lines or redundant memory blocks in the memory. The invention relates to any types of integrated memories in which redundant addressable units with memory cells are used.

The exemplary embodiment shown in FIG. 1 is a DRAM whose memory cells MC each contain a selection transistor and a storage capacitor. In this arrangement, control inputs for the selection transistors are connected to one of the word lines WL, while a primary current path of the selection transistors is arranged between the storage capacitor in the respective memory cell MC and one of the bit lines BL.

The integrated memory shown in FIG. 1 also has a volatile first memory unit 10 for storing the address, determined by the self-test unit 30, of the standard word line WL which is to be replaced. The first memory unit 10 is a shift register with register elements 1 for storing one address bit each. The self-test unit 30 transmits the address to be stored via a bus 40 to the first memory unit 10. The first memory unit 10 in FIG. 1 has only three register elements 1, so that only one 3-bit word line address can be stored. In practice, word line addresses have a greater number of bits, however, so that a correspondingly greater number of register elements 1 is necessary.

First outputs of the register elements 1 are connected to corresponding inputs of a comparison unit CMP, which is also connected to an address bus ADR for the memory. The comparison unit CMP performs a comparison between the address stored in the first memory unit 10 and the current address present on the address bus ADR. If the current address is found to match the address stored in the first memory unit 10, the comparison unit CMP activates the redundant word line RWL and deactivates a word line decoder WLDEC by means of a deactivation signal $\overline{EN}$. The word line decoder WLDEC is likewise connected to the address bus ADR and, when active, activates one of the standard word lines WL assigned to the corresponding address. However, if the redundant word line RWL has been addressed, the standard word line WL which is to be replaced needs to be prevented from being activated. This is accomplished by the comparison unit CMP using the deactivation signal $\overline{EN}$.

Each of the register elements 1 has a clock input connected to a control clock CLK which can be supplied externally. The register elements 1 form a shift register with an output which is connected to an output OUT of the integrated circuit. The clock signal CLK is used to output the address stored in the first memory unit 10 at the output OUT bit by bit.

The memory in FIG. 1 also has a second memory unit 20 with memory elements 2 which are used to store one address bit each. The second memory unit 20 is nonvolatile and contains laser fuses which can be programmed from outside the integrated circuit using a laser beam. The memory elements 2 are connected to the corresponding register element 1 via a respective switching transistor T. Control inputs for the switching transistors T are connected to a control signal A which enables simultaneous transmission of all the bits of the address stored in the second memory unit 20 to the first memory unit 10.

Figure 2:
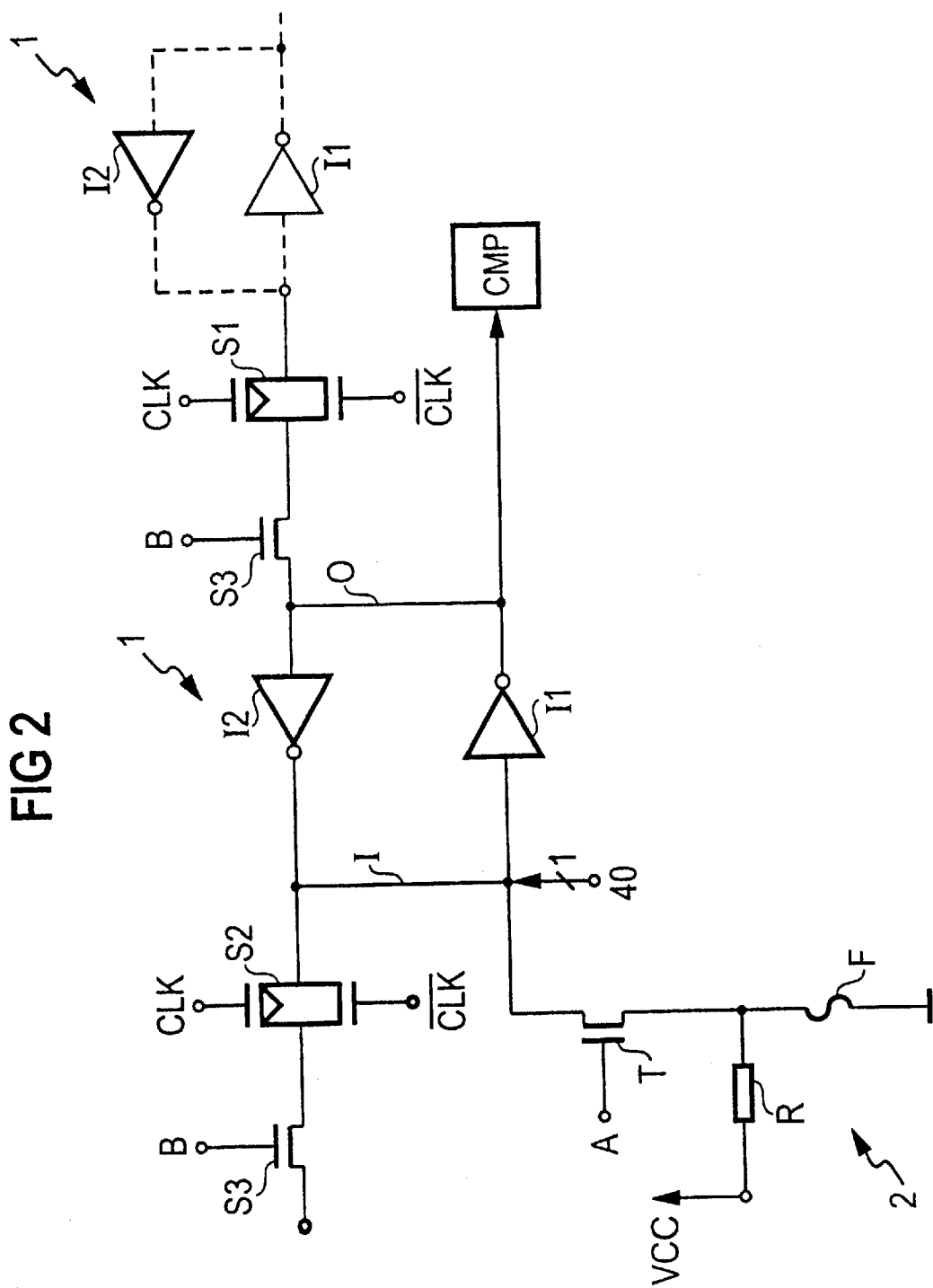
FIG. 2 is a schematic diagram of an exemplary embodiment of a register stage in a first memory unit and of a memory element in the second memory unit of FIG. 1.

FIG. 2 is a more detailed view of a part of the exemplary embodiment shown in FIG. 1. One of the register elements 1 is shown in FIG. 2 which is formed by a hold circuit which has a first inverter I1 and an inverter I2 arranged parallel to one another in opposite directions. An output 0 of the register element 1 is connected firstly to the comparison unit CMP. It is secondly connected via a first switching element S1 in the form of a transfer gate to the input of the next register element 1, which is indicated in FIG. 2 only in dashed lines. An input I of the register element 1 is connected via a second switching element S2, also a transfer gate, to the output of the preceding register element 1. The output of the last register element 1 of the shift register (not shown in FIG. 2) is, as shown in FIG. 1, connected to the output OUT of the integrated circuit. The control connections for the transfer gates S1, S2 in FIG. 2 are connected to the clock signal CLK such that only one of the two is ever turned on at the same time and the other is turned off. In addition, the transfer gates S1, S2 each have a third switching element S3 connected upstream in the form of an n-channel transistor. All the third switching elements S3 are driven by means of a common control signal B. The control signal B prevents the shift function of the shift register if reading the address stored in the first memory unit via the output OUT is not desirable.

The input I of the shift register 1 in FIG. 2 is firstly connected to one of the lines of the bus 40. In addition, the input I is connected via one of the switching transistors T to the corresponding memory element 2 in the second memory unit 20. The memory element 2 has a laser fuse F between the switching transistor T and ground, and a resistor R between the switching transistor T and a supply potential VCC. The laser fuse F can be severed from outside the integrated circuit using a laser beam. Depending on whether or not the fuse F has been severed, the appropriate memory element 2 stores an address bit with the status "1" or "0".

The operation of the memory of FIG. 1 is explained below:

After the self-test unit 30 has determined which of the standard word lines WL is to be replaced by the redundant word line RWL, the appropriate address is transmitted to the first memory unit 10. The written address bits are then output serially via the output OUT using the clock signal CLK. The address which is output in this way is then programmed into the memory elements 2 in the second memory unit 20 using an external programming device. This is done by means of a laser beam by selectively severing the laser fuses F. While the switching transistors T are firstly turned off by the control signal A, they are turned on when the memory is initialized or started up, so that the address bits permanently programmed into the memory elements 2 are transmitted to the appropriate register elements 1. In this way, the address of the standard word line WL to be replaced is stored in the volatile first memory unit 10 again without having to be determined by the self-test unit 30 again (in other exemplary embodiments, this is also possible, however, so that the second memory unit can then be dispensed with). The address stored in the first memory unit is then available again for a comparison performed by the comparison unit CMP. The switching transistors T are turned on briefly only to transmit the address stored in the second memory unit 20 to the first memory unit 10, and are then turned off. This prevents any current loss occurring between the input I (shown in FIG. 2) of the register elements 1 and the memory elements 2, and prevents the address bits shifted from register element to register element during the shift operation performed by means of the switching elements S1, S2, S3 from being corrupted.

The volatile first memory unit 10 is used for storing the address transmitted by the self-test unit 30, for outputting this address in serial form via the output OUT and for storing the address transmitted by the second memory unit 20 whenever the memory has been initialized or started up after the second memory unit 20 has been programmed.

So that the address stored in the first memory unit 10 continues to be stored after it has been output, the shift register can also be implemented as a ring memory. After all the address bits have been output, the complete address is in its original form in the first memory unit.

We claim:

1. An integrated memory of an integrated circuit, comprising:
   a plurality of memory cells combined to form individually addressable standard units;
   a redundant unit for replacing one of said standard units on an address basis;
   a self-test unit adapted to perform a function test on said memory cells and to analyze which of said standard units is to be replaced with said redundant unit;
   a first memory unit for storing an address, determined by said self-test unit, of said standard unit to be replaced by said redundant unit;
   an address bus; and
   a comparison unit connected to said address bus and to outputs of said first memory unit, for comparing an address present on said address bus with the address stored in the first memory unit and for activating said redundant unit if the addresses match;
   said first memory unit having at least one output connected to an output of the integrated circuit for outputting the address stored in the first memory unit.

2. The integrated memory according to claim 1, wherein said redundant unit is one of a plurality of redundant units.

3. The integrated memory according to claim 1, wherein said first memory unit is a volatile memory unit, and further comprising a nonvolatile second memory unit for storing an address supplied from outside the integrated circuit, said second memory unit having at least one output which is connected to a corresponding input of said first memory unit for transmitting an address stored in said second memory unit to said first memory unit.

4. The integrated memory according to claim 3, wherein said second memory unit includes nonvolatile memory elements for storing the address, said nonvolatile memory elements having electrical connections severable with an energy beam.

5. The integrated memory according to claim 1, wherein said output of said first memory unit is a serial output for outputting the stored address bit by bit.

6. The integrated memory according to claim 5, wherein said first memory unit is a shift register.

* * * * *